United States Patent
Hong et al.

(10) Patent No.: US 10,784,193 B2
(45) Date of Patent: Sep. 22, 2020

(54) IC WITH THIN FILM RESISTOR WITH METAL WALLS

(71) Applicant: Texas Instruments Incorporated, Dallas, TX (US)

(72) Inventors: Qi-Zhong Hong, Richardson, TX (US); Honglin Guo, Dallas, TX (US); Benjamin James Timmer, Dallas, TX (US); Gregory Boyd Shinn, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/047,889

(22) Filed: Jul. 27, 2018

(65) Prior Publication Data

US 2020/0035598 A1   Jan. 30, 2020

(51) Int. Cl.
*H01L 23/52*      (2006.01)
*H01L 23/522*     (2006.01)
*H01L 49/02*      (2006.01)

(52) U.S. Cl.
CPC ...... *H01L 23/5228* (2013.01); *H01L 23/5226* (2013.01); *H01L 28/24* (2013.01)

(58) Field of Classification Search
CPC .. H01L 23/5228; H01L 23/5226; H01L 28/24
USPC ....................................................... 257/538
See application file for complete search history.

(56) References Cited

U.S. PATENT DOCUMENTS

| | | | |
|---|---|---|---|
| 6,081,014 A * | 6/2000 | Redford | H01C 7/006 257/358 |
| 6,475,873 B1 * | 11/2002 | Kalnitsky | H01L 27/0802 257/359 |
| 9,455,312 B2 | 9/2016 | Liu et al. | |
| 10,276,648 B1 * | 4/2019 | Liu | H01L 28/24 |
| 2004/0152299 A1 | 8/2004 | Mahalingam et al. | |
| 2006/0238292 A1 | 10/2006 | Beach et al. | |
| 2009/0023263 A1 | 1/2009 | Phan et al. | |
| 2015/0069574 A1 | 3/2015 | Tseng et al. | |
| 2018/0130849 A1 | 5/2018 | Lee et al. | |

FOREIGN PATENT DOCUMENTS

WO   2018004645 A1   4/2018

* cited by examiner

*Primary Examiner* — Caleen O Sullivan
(74) *Attorney, Agent, or Firm* — Jacqueline J. Garner; Charles A. Brill; Frank D. Cimino

(57) ABSTRACT

An integrated circuit (IC) includes a substrate having a semiconductor surface layer with functional circuitry for realizing at least one circuit function, with an inter level dielectric (ILD) layer on a metal layer that is above the semiconductor surface layer. A thin film resistor (TFR) including a TFR layer is on the ILD layer. At least one vertical metal wall is on at least two sides of the TFR. The metal walls include at least 2 metal levels coupled by filled vias. The functional circuitry is outside the metal walls.

20 Claims, 11 Drawing Sheets

IC WITH THIN FILM RESISTOR WITH METAL WALLS

FIELD

This Disclosure relates to semiconductor integrated circuit (IC) devices having thin film resistors (TFRs).

BACKGROUND

Some IC devices include TFRs. A TFR generally has a thickness on the order of 0.1 µm or smaller, while thick film resistor is generally a thousand times thicker. Silicon Chromium (SiCr) and nickel chromium (NiCr) have been used for years as TFRs due to their high electrical resistance in thin film form, relatively low temperature coefficient of resistance (TCR), and the ability to reliably carry relatively high current density. TFRs may be laser trimmed, particularly for precision ICs, such as for setting an operational-amplifier's offset voltage or a voltage regulator's output voltage.

Laser trimming is accomplished by ablating away part of the TFR structure using a laser beam. As the TFR's effective cross-sectional area is reduced, its resistance increases. The laser trimming is commonly performed in conjunction with wafer probing.

SUMMARY

This Summary is provided to introduce a brief selection of disclosed concepts in a simplified form that are further described below in the Detailed Description including the drawings provided. This Summary is not intended to limit the claimed subject matter's scope.

An IC includes a substrate having a semiconductor surface layer with functional circuitry for realizing at least one circuit function, with an inter level dielectric (ILD) layer on a metal layer that is above the semiconductor surface layer. A TFR including a TFR layer is on the ILD layer. At least one vertical metal wall is on at least two sides of the TFR. The metal walls include at least 2 metal levels coupled together by filled vias. The functional circuitry is outside the metal walls.

BRIEF DESCRIPTION OF THE DRAWINGS

Reference will now be made to the accompanying drawings, which are not necessarily drawn to scale, wherein.

DETAILED DESCRIPTION

Figure 1A:
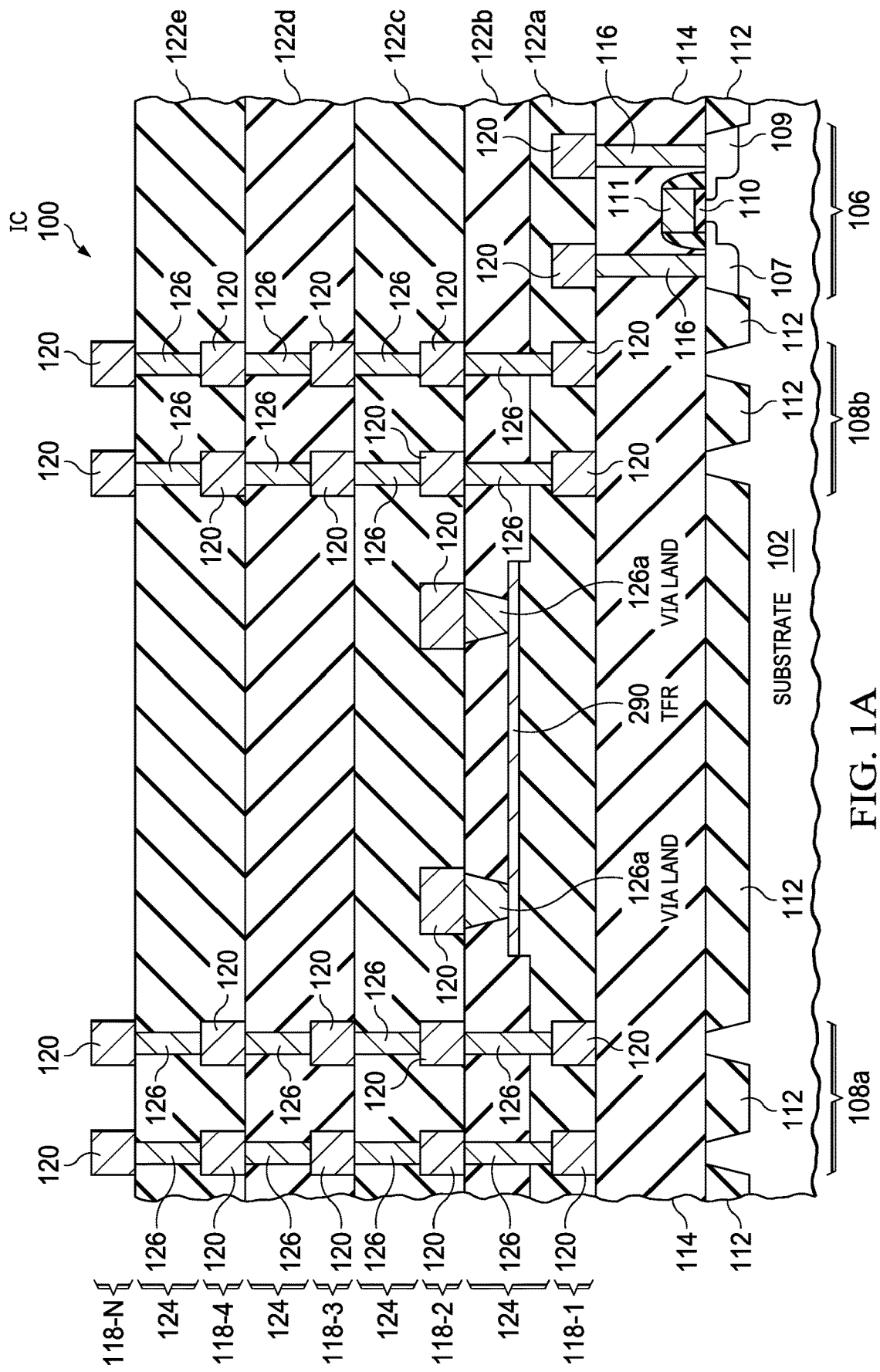
FIG. 1A depicts a cross-sectional view of a portion of an example IC having a TFR including disclosed metal walls that at least partially enclose the TFR.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

This Disclosure recognizes possible dielectric damage created during the laser trimming of a TFR can cause quality and reliability risks for the IC, such as increased leakage current, and reduced mechanical strength. Disclosed ICs feature TFRs that have at least partially surrounding metal walls that can reduce or eliminate the impact of laser trimming induced dielectric damage by containing the dielectric damage so that it does not extend beyond the metal walls. Disclosed metal walls comprise metal layers and filled vias (e.g., tungsten filled) that couple together at least 2 different metal levels.

FIG. 1A depicts a cross-sectional view of a portion of an example IC 100 having a TFR 290 including surrounding metal walls 108a and 108b that at least partially enclose the TFR 290. The IC 100 is formed on a substrate 102 such as a silicon wafer. The substrate 102 can comprise a bulk substrate material such as silicon, or an epitaxial layer on a bulk substrate material. Alternatively, the substrate can comprise silicon-germanium, other Group 4 material, or other semiconductor materials including III-V and II-VI compound semiconductor materials.

The IC 100 includes at least one TFR shown as TFR 290 that has its respective ends connected to a first node and a second node, respectively, on the IC 100. In the view shown in FIG. 1A the metal walls 108a and 108b are shown as double metal walls on positioned on two of the sides of the TFR 290.

TFR 290 can comprise chromium or doped polysilicon, and is shown on an Inter-level dielectric (ILD) layer 122a. TFR 290 is generally 1 nm to 100 nm thick, and generally has a sheet resistance of 100 to 1,000 ohms/sq. The TFR 290 is contacted by via lands shown as 126a.

A field oxide (FOX) layer or FOX region 112 is formed in the substrate 102 (e.g., near or adjacent to a top surface of the substrate 102) to laterally electrically isolate elements of the IC 100. A pre-metal dielectric (PMD) layer 114 is formed over the substrate 102 including over any FOX region 112 prior to the deposition of subsequent metal layers 118-1 to 118-N, where 118-1 can be called Metal 1 (M1), and 118-N the top metal layer in the example being M5. The metal layers 118-1 to 118-N can comprise aluminum or copper, or their respective alloys. Contacts 116 may be disposed through the PMD layer 114 to provide electrical connections for IC components such as the metal oxide semiconductor (MOS) transistor 106 that includes a gate electrode 111 on a gate dielectric 110, and a source 107 and a drain 109. Although the metal walls 108a and 108b are shown are electrically isolated from the semiconductor surface layer of the substrate 102, there can be contacts for grounding the metal walls 108a and 108b to the substrate 102.

The plurality of metal levels 118-1 to 118-N disposed over the PMD layer 114 may include metal interconnects 120 including some connected to functional circuitry shown by the MOS transistor 106 and the metal walls 108a, 108b, as well as any additional components, devices, or circuit portions. ILD layers shown as 122a-e (e.g., dielectric materials or compositions comprised of silicon dioxide-based materials and the like) are disposed between the metal interconnects 120 in each metal level and between the respective metal levels.

Respective via levels 124 are disposed between the metal levels 118-1 to 118-N, wherein the example via levels 124 may include metal vias 126 providing a connection between metal interconnects 120 in adjacent levels. In one arrangement, the various dielectric layers may be formed in a similar process flow using similar materials. It should be understood that other dielectric materials for the ILD layers, such as low dielectric constant ($\kappa$) materials, are within the scope of the instant example, for instance, FSG (Fluorinated Silicate Glass with $\kappa=3.6$), OSG (Organo-silicate Glass with $\kappa=2.9$) and ULK (Ultra-low k Dielectric material, with $\kappa=2.5$). The ILD layers may possibly include cap layers and etch stop layers of different dielectric materials, such as silicon nitride, and silicon carbide.

Disclosed metal walls 108a, 108b can be single metal walls, double metal walls or three or more metal walls along with corresponding via rows. The metal walls 108a, 108b can involve any or all of the metal layers on the IC 100, so that they can comprise aluminum or copper, or their respective alloys. The vias 126 used in the metal walls can include any via level or via levels combined. The width of the metal in disclosed metal walls 108a, 108b can be sized at a minimum for the metal layers, but is not limited to being the minimum size. The via 126 size can also be a minimum for vias on the IC, but is not limited to being the minimum via size. The metal on the metal levels for the metal walls 108a, 108b can comprise metal islands so that they are not connected to one another.

Figure 1B:
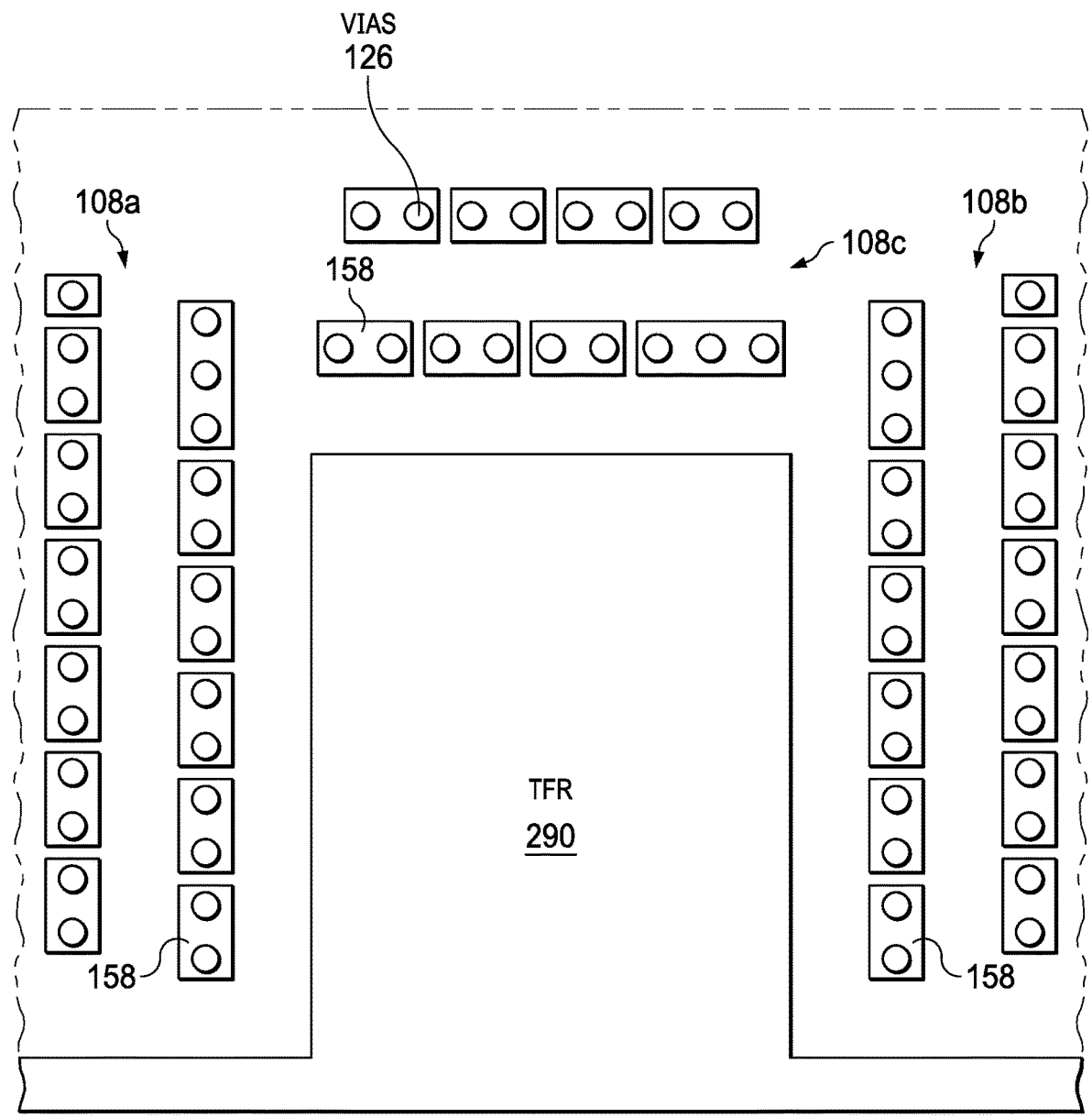
FIG. 1B is a top down view of a disclosed TFR having metal walls that at least partially enclose the by walling off 3 of 4 sides of the TFR.

FIG. 1B is a top down view of a disclosed TFR 290 having metal walls shown as 108a, 108b and 108c that at least partially enclose the TFR 290 by walling off 3 of 4 sides of the TFR 290. The metal walls each comprise a plurality of metal islands shown as 158 that may comprise M1, M2, M3, M4 and M5 connected by vias 126 that shown arranged in 2 rows that have the metal islands 158 staggered from one another. The metal arrangement on the top level (such as M5) has metal islands 158 that each have 2 or 3 metal vias 126 therein, and the metal walls can extend from M1 corresponding to 118-1 in FIG. 1A to a top metal level such as M5 corresponding to 118-N shown in FIG. 1A. The metal islands 158 can be are isolated from (shown in FIG. 1A) or instead connected to the substrate 102, are isolated from the functional circuitry on the IC, are proximate to the TFR 290 to not have any intervening structure between the TFR 290 and the metal islands 158.

Figure 1C:
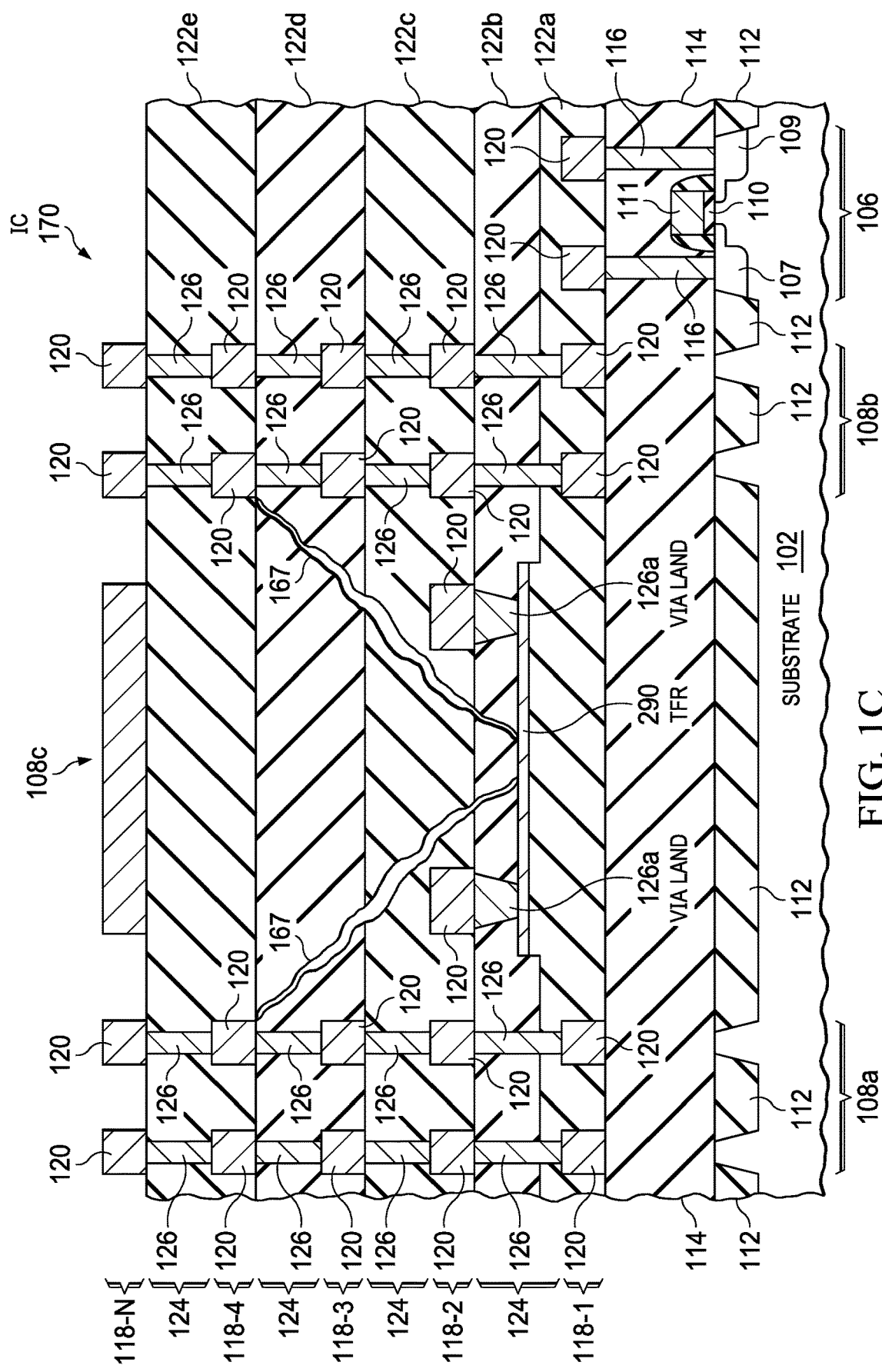
FIG. 1C is a cross section view of IC shown having a TFR at least partially surrounding the 3 metal walls shown in FIG. 1B.

FIG. 1C is a cross section view of IC shown as 170 having a TFR 290 with the at least partially surrounding 3 metal walls 108a, 108b and 108c shown in FIG. 1B. Damage 167 to ILDs 122b, 112c and 122d shown as cracks from laser trimming is shown contained within the metal walls 108a and 108b.

Figure 2A:
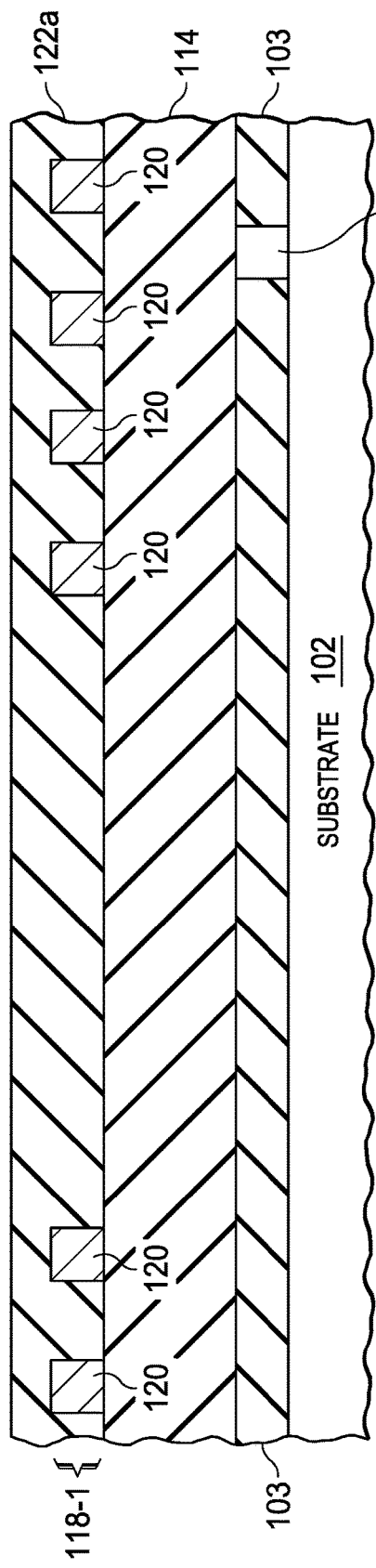
FIGS. 2A-2J are cross-sectional diagrams showing process progression for an example method of forming an IC having metal walls that at least partially enclose a TFR, according to an example aspect.

Disclosed aspects include a method of fabricating ICs including TFRs having metal walls that at least partially enclose the TFR. FIG. 2A shows the in-process IC after depositing an ILD layer shown as 122a on a substrate 102 including a semiconductor surface layer 103 having a plurality of IC die (e.g., a wafer) formed therein each including functional circuitry 180 comprising a plurality of interconnected transistors such as including MOS transistor 106 shown in FIG. 1A. Metal layer 118-1 is on PMD 114 and is under the ILD layer shown as 122a. The functional circuitry (see functional circuitry 180 in FIGS. 2A-2I described below) is generally formed in the substrate 102 before forming the TFRs. Functional circuitry as used herein realizes and carries out a desired functionality, such as that of a digital IC (e.g., digital signal processor) or analog IC (e.g., amplifier or power converter), and in one aspect a BiCMOS (MOS and Bipolar) IC. The capability of functional circuitry provided on a disclosed IC may vary, for example ranging from a simple device to a complex device. The specific functionality contained within functional circuitry is not of importance to disclosed ICs.

The ILD layer 222a can comprise a tetraethoxysilane TEOS-derived silicon oxide layer. However, other dielectric films can also be used for disclosed ILD layers including deposited silicon oxides such as comprising an organosilicate glass (OSG), a low-k dielectric (i.e., a smaller dielectric constant relative to silicon dioxide), a doped dielectric layer such as a fluorine-doped silica glass (FSG), or a SiN layer or its variants (e.g., SiON).

Figure 2B:
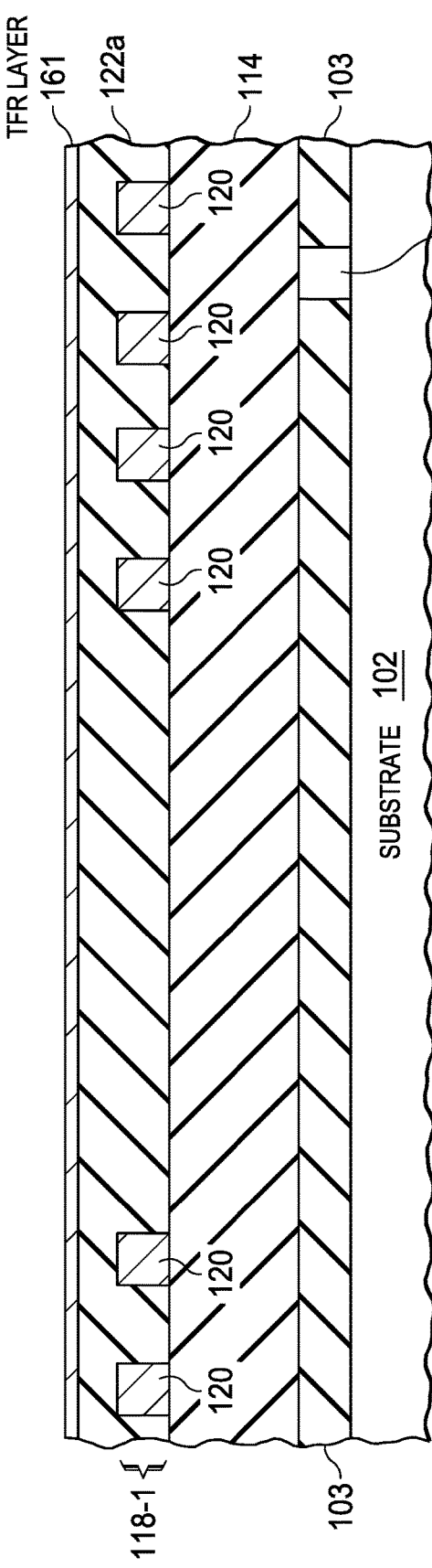

FIG. 2B shows the in-process IC after depositing a TFR layer 161 on the ILD layer 122a. The deposition process can comprise a direct current (DC) or radio frequency (RF) sputtering process. The TFR layer 161 can comprise SiCr or its alloys such as carbon containing including SiCCr, SiCOCr where C can be 1 atomic % to 50 atomic %, or NiCr or its alloys such as NiCrFe 61% Ni, 15% Cr, 24% Fe (all atomic % s), or doped polysilicon. The thickness of the TFR layer 161 is generally 1 nm to 50 nm, such as 2 nm to 10 nm, or about 3 to 5 nm in one specific aspect.

Figure 2C:
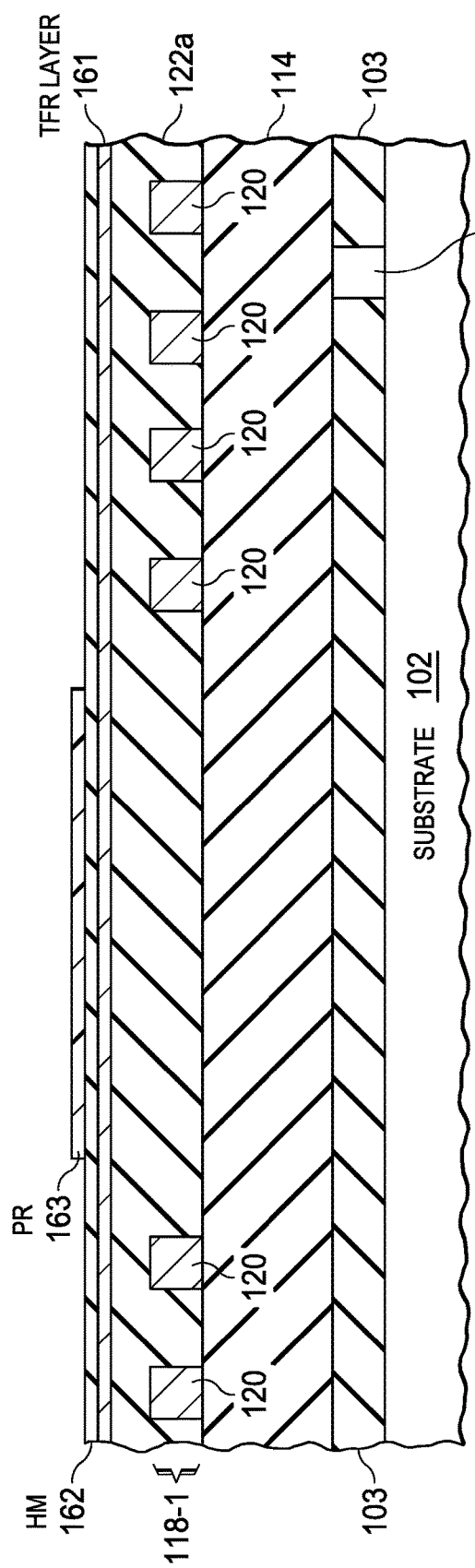

FIG. 2C shows the in-process IC after depositing a hardmask layer shown as HM 162 (e.g., a TEOS derived HM layer) and then forming a pattern on the HM layer 162. Photoresist 163 can be used to form a pattern. This deposition process can comprise low pressure CVD (LPCVD) at a pressure of about 300 mTorr and at a temperature of about 700° C. for a TEOS-based deposition process. The HM layer 162 thickness range can be 20 A to 300 A.

Figure 2D:
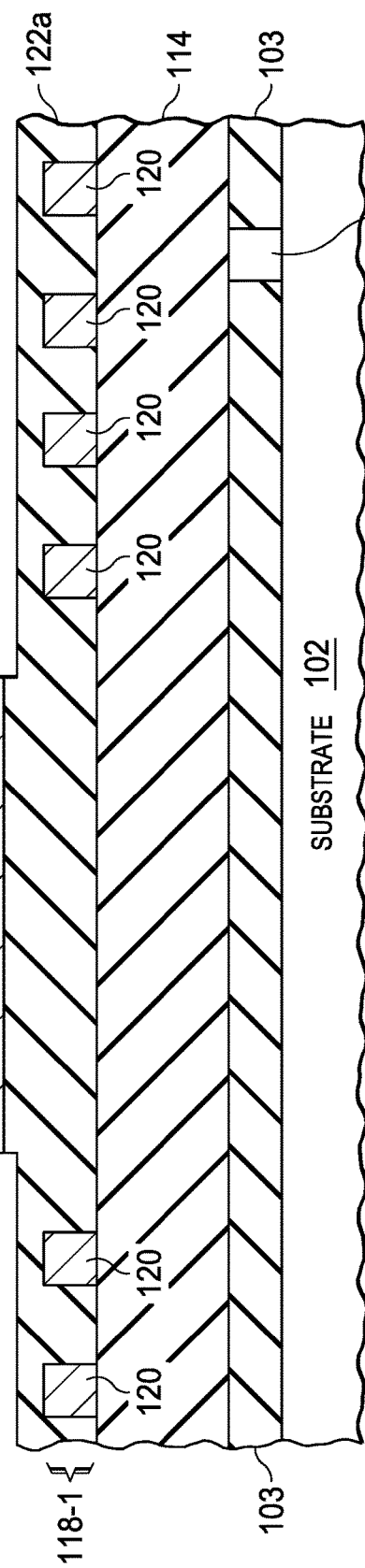

FIG. 2D shows the in-process IC after etching the HM layer 162 and TFR layer 161 stopping in the ILD layer 122a to form at least one TFR 290 that comprises the TFR layer, and then stripping of the PR layer 163. The etch gases for HM layer etch in the case of silicon oxide can be Ar and $CF_4$ with optional $Cl_2$. The etch gases used for etching the TFR layer 161 generally includes flowing $O_2$, $Cl_2$, and at least one carbon-halogen gas. For example, $O_2$, $Cl_2$, and $CF_4$ with optional Ar may be used for etching SiCr. In addition other gasses may also be used for etching the TFR layer such as $CHF_3$, or $CH_2F_2$ as a replacement for or in addition to $CF_4$, and/or $N_2$ used as well.

Figure 2E:
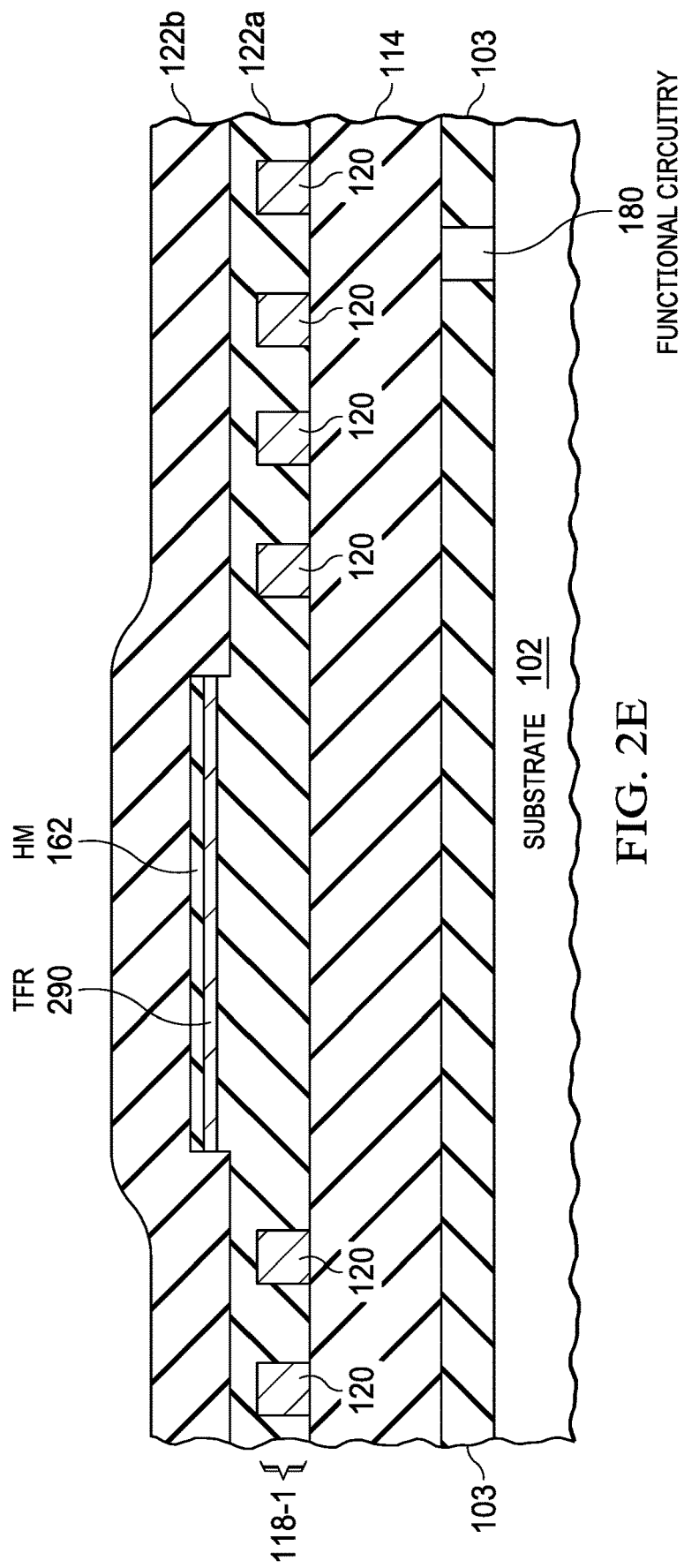
Figure 2F:
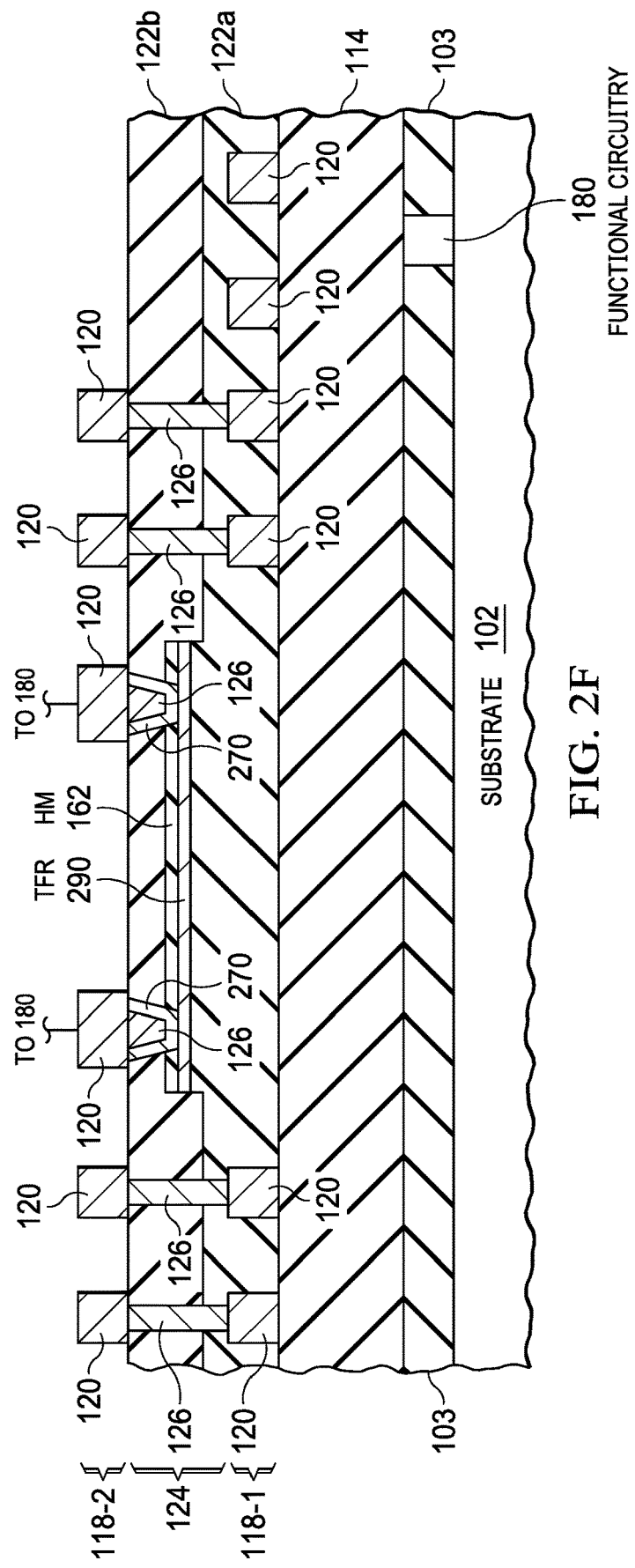

FIG. 2E shows the in-process IC after the deposition of a second ILD layer shown as ILD layer 122b. The ILD layer 122b generally comprises a deposited silicon oxide. FIG. 2F shows the in-process IC after forming vias 126 through the ILD 122b and HM layer 162 to expose contacts on the TFR layer 161, and then depositing and patterning another metal layer shown by example as a thick SiCr layer 270 (being thick as compared to TFR layer 161, such as at least 10 times thicker, e.g., 50 A to 600 A thick). The thick SiCr layer 270 can be called the TFR head which is shown formed in the ILD layer 122b. A plasma etch or a wet etch can be used to form vias 126 in the ILD layer 122b for the TFR heads. Metal interconnects 120 contact the vias 126 and the thick SiCr layer 270.

Figure 2G:
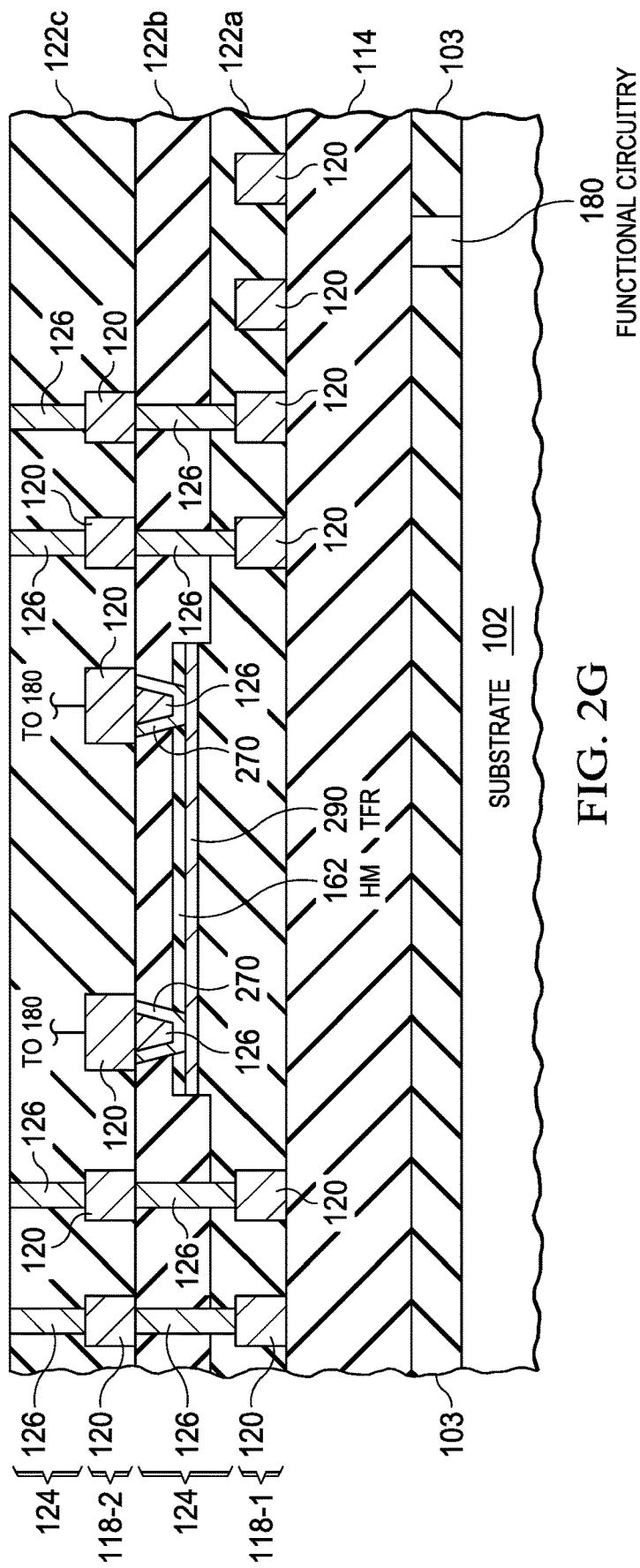
Figure 2H:
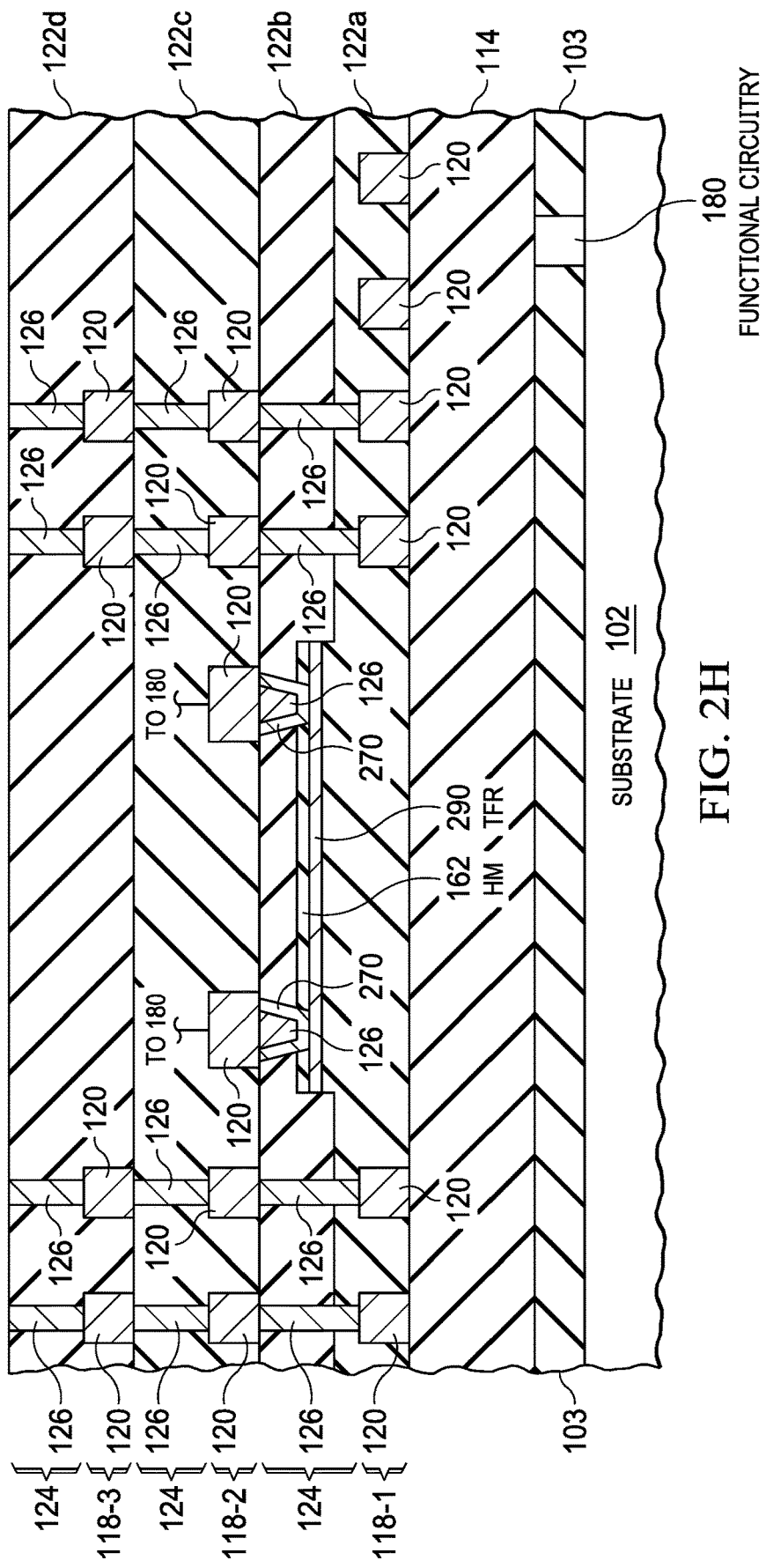
Figure 2I:
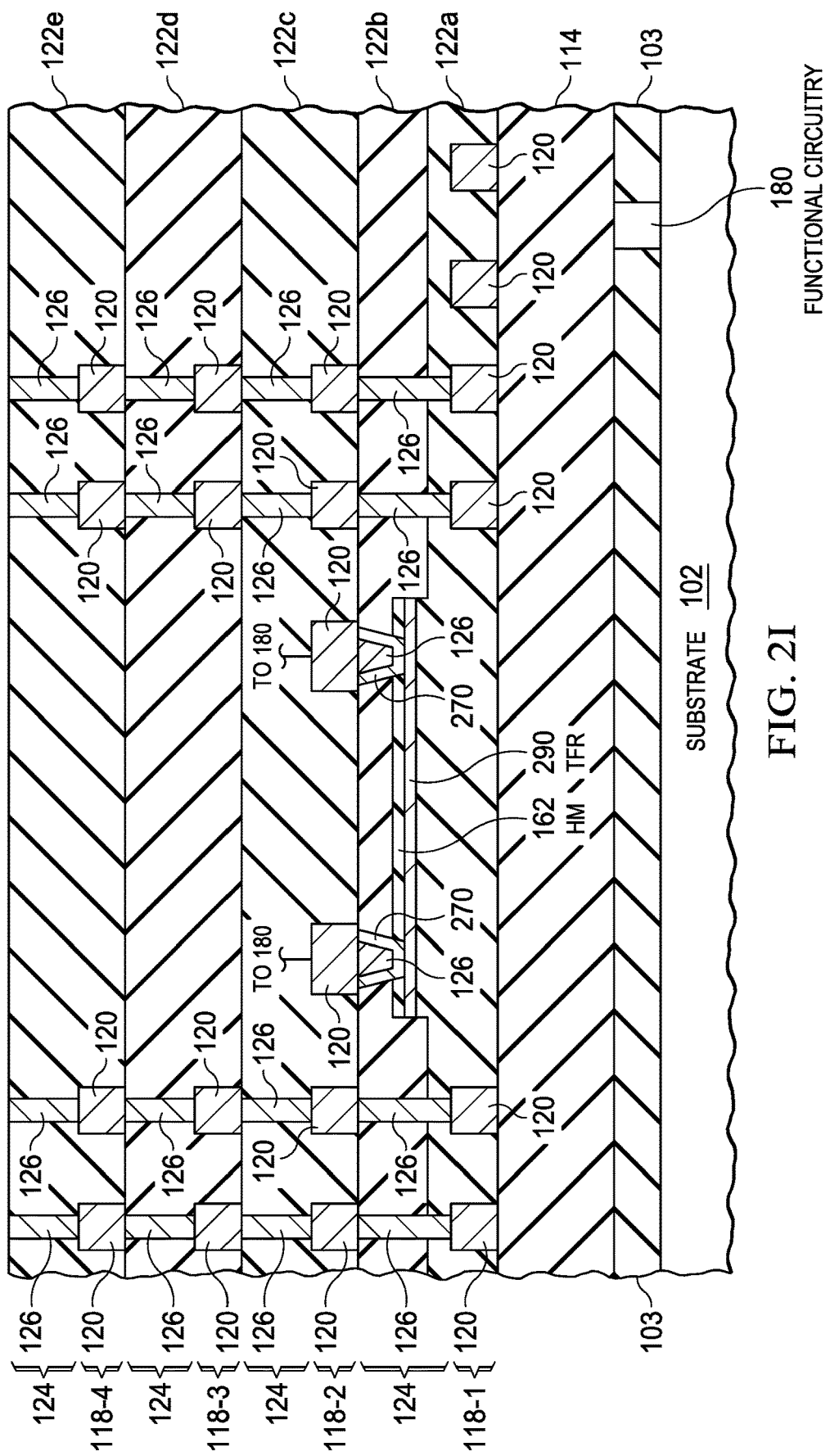
Figure 2J:
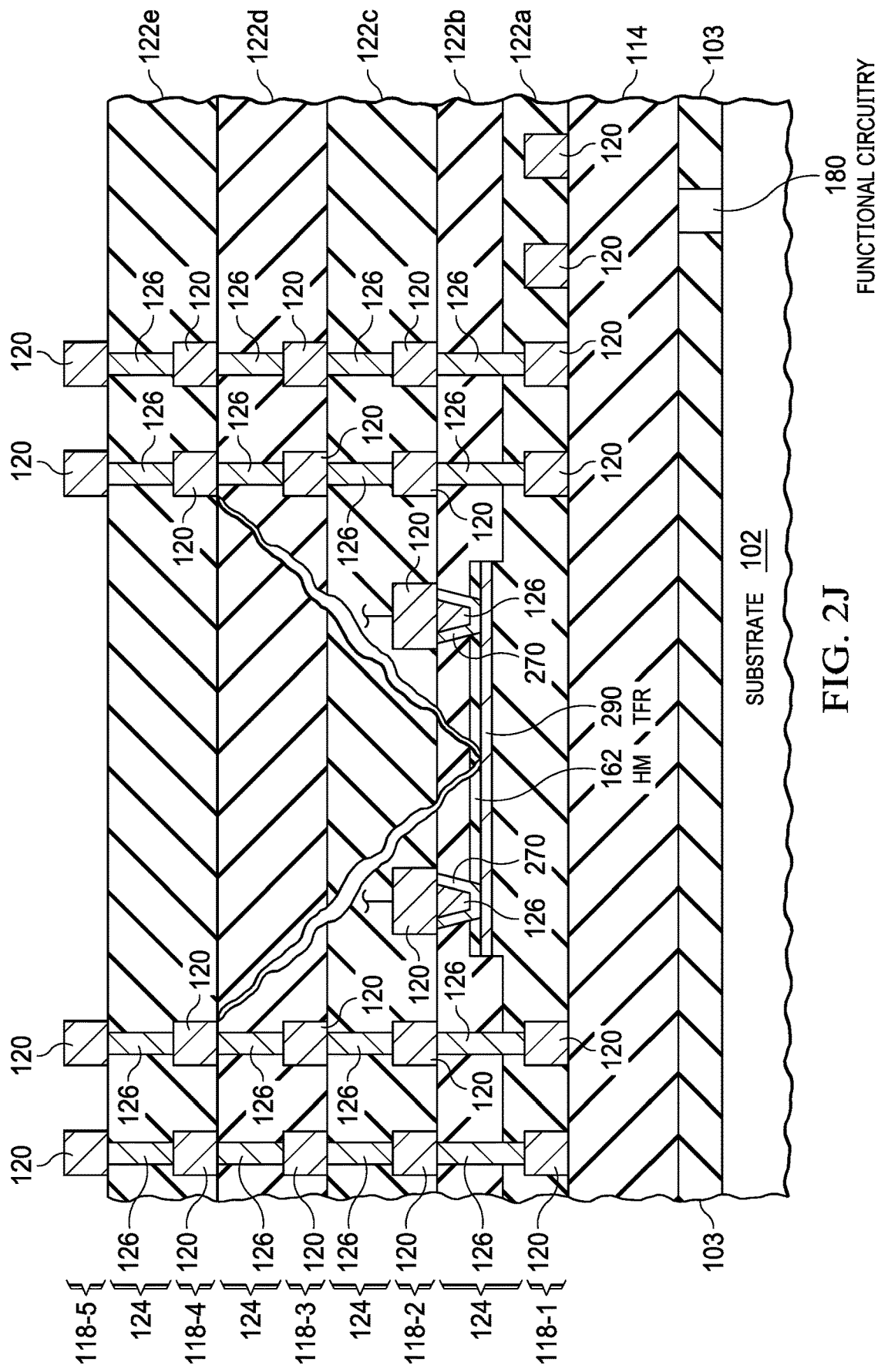

FIG. 2G shows the in-process IC after depositing metal layer 118-2 (M2) and then defining it, depositing an ILD layer 122c, and forming vias 126 in the ILD layer 122c. FIG. 2H shows the in-process IC after depositing metal layer 118-3 (M3) and defining it, depositing an ILD layer 122d, and forming vias 126 in the ILD layer 122d. FIG. 2I shows the in-process IC after depositing metal layer 118-4 (M4) and defining it, depositing an ILD layer 122e, and forming vias 126 in the ILD layer 122e. FIG. 2J shows the in-process IC after depositing metal layer 118-5 (M5) and defining it on the vias 126 in the ILD layer 122e.

The IC can then be completed by known conventional back end of the line (BEOL) processing comprising optionally forming one or more additional metal levels including filled vias thereon to add to the metal walls to optionally include metal levels up to the top metal level. The top metal layer as the other metal layers can comprise aluminum or copper, or their respective alloys. Passivation overcoat (PO) then generally follows, followed by patterning the PO. The PO layer comprises at least one dielectric layer such as silicon oxide, silicon nitride, or SiON. As noted below, in the final IC, the TFRs 290 are connected within the functional circuitry 180, such as through M2 connections that through vias and contacts reach nodes within the circuitry in the semiconductor surface layer 103.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. A method of fabricating an integrated circuit (IC), comprising:
   providing a substrate having a semiconductor surface layer with functional circuitry for realizing at least one circuit function, with an inter level dielectric (ILD) layer on a metal layer that is above the semiconductor surface layer;
   forming a thin film resistor (TFR) comprising a TFR layer on the ILD layer;
   forming at least one vertical metal wall on at least two sides of the TFR;
   wherein the metal walls include at least 2 metal levels coupled by filled vias, and
   wherein the functional circuitry is outside the metal walls.

2. The method of claim 1, wherein the TFR layer comprises silicon chromium (SiCr) or nickel chromium (NiCr).

3. The method of claim 2, wherein the TFR layer comprises doped polysilicon.

4. The method of claim 1, wherein a thickness of the TFR layer is 1 nm to 100 nm.

5. The method of claim 1, further comprising laser trimming the TFR.

6. The method of claim 1, wherein the metal walls each include at least 2 of the metal walls.

7. The method of claim 1, wherein the at least 2 metal levels of the metal walls include a staggered plurality of metal islands.

8. The method of claim 1, wherein the at least 2 metal levels of the metal walls share a minimum width on the IC.

9. The method of claim 1, wherein the metal walls are electrically isolated from the semiconductor surface layer.

10. The method of claim 1, wherein the TFR has a sheet resistance of 100 to 1,000 ohms/square.

11. A method of fabricating an integrated circuit (IC), comprising:
    forming IC components at a semiconductor surface layer of a substrate;
    forming an inter level dielectric (ILD) layer on a metal layer that is above the semiconductor surface layer;
    forming a resistor comprising a resistor layer on the ILD layer;
    forming at least one vertical metal wall on at least two sides of the resistor;
    wherein the metal walls include at least 2 metal levels coupled by filled vias, and wherein the IC components are outside the metal walls relative to the resistor.

12. The method of claim 11, wherein the resistor layer comprises silicon chromium (SiCr) or nickel chromium (NiCr).

13. The method of claim 12, wherein the resistor layer comprises doped polysilicon.

14. The method of claim 11, wherein a thickness of the resistor layer is 1 nm to 100 nm.

15. The method of claim 11, further comprising laser trimming the resistor.

16. The method of claim 11, wherein the metal walls each include at least 2 of the metal walls.

17. The method of claim 11, wherein the at least 2 metal levels of the metal walls include a staggered plurality of metal islands.

18. The method of claim 11, wherein the metal walls are electrically isolated from the semiconductor surface layer.

19. The method of claim 11, wherein the resistor has a sheet resistance of 100 to 1,000 ohms/square.

20. A method of fabricating an integrated circuit (IC), comprising:
    forming IC components at a semiconductor surface layer of a substrate;
    forming an inter level dielectric (ILD) layer on a metal layer that is above the semiconductor surface layer;
    forming a resistor comprising a resistor layer on the ILD layer, wherein the resistor layer comprises chromium;
    forming two vertical metal walls on each of at least two sides of the resistor;
    wherein each of the metal walls include at least 3 metal levels coupled by filled vias, wherein the IC components are on an opposite side the metal walls from the resistor, and wherein the metal walls are electrically isolated from the semiconductor surface layer.

* * * * *